United States Patent [19]

Zuleeg

[11] 3,967,305

[45] June 29, 1976

[54] MULTICHANNEL JUNCTION FIELD-EFFECT TRANSISTOR AND PROCESS

[75] Inventor: Rainer Zuleeg, Huntington Beach, Calif.

[73] Assignee: McDonnell Douglas Corporation, Long Beach, Calif.

[22] Filed: Mar. 27, 1969

[21] Appl. No.: 811,154

[52] U.S. Cl. ................................. 357/3; 29/571; 29/580; 148/175; 357/22; 357/15; 357/36; 357/41; 357/56
[51] Int. Cl.² .................. H01L 21/78; H01L 27/26
[58] Field of Search ............... 357/3, 22, 36, 41, 56; 148/1.5, 175, 187; 29/571, 580

[56] References Cited
UNITED STATES PATENTS

| | | | |
|---|---|---|---|
| 3,230,428 | 1/1966 | Evans | 317/235 |
| 3,275,845 | 9/1966 | Csanky | 317/235 A |
| 3,283,221 | 11/1966 | Heiman | 317/235 |
| 3,293,512 | 12/1966 | Simmons et al. | 317/235 |
| 3,335,342 | 8/1967 | Leistiko et al. | 317/235 A |
| 3,363,152 | 1/1968 | Lin | 317/235 |
| 3,405,330 | 10/1968 | Hilbiber | 317/235 |
| 3,409,812 | 11/1968 | Zuleeg | 317/235 |
| 3,424,956 | 1/1969 | Sato et al. | 317/235 AK |
| 3,443,169 | 5/1969 | Foxell et al. | 317/234 V |
| 3,449,648 | 6/1969 | Beale et al. | 317/235 |
| 3,461,360 | 8/1969 | Barson et al. | 317/235 |
| 3,484,662 | 12/1969 | Hagon | 317/235 |
| 3,487,338 | 12/1969 | Matzelle et al. | 317/234 V |
| 3,516,021 | 6/1970 | Kohn | 317/235 |
| 3,518,749 | 7/1970 | Norton | 317/234 V |
| 3,528,035 | 8/1970 | Uenohara | 317/234 V |

OTHER PUBLICATIONS

Petzinger et al., "CW Three-terminal GaAs Oscillator", IEEE Trans. Electron Devices, July 1967, pp. 403–404.
Hooper et al., "An Epitaxial GaAs Field Effect Transistor", IEEE Proceedings, pp. 1237–1238, July 1967.
DeWitt, "Field Effect Transistor", IBM Tech. Discl. Bull, vol. 9, No. 1, p. 102 (June 1966).

*Primary Examiner*—William D. Larkins
*Attorney, Agent, or Firm*—D. N. Jeu; Walter J. Jason; Donald L. Royer

[57] ABSTRACT

A single gate field-effect transistor including a semi-insulating substrate for providing a one-sided device geometry, an isolating mesa formed from a layer of semi-conductor material provided on a substrate surface and which exhibits bulk negative resistance instabilities above a critical electric field strength, an extended gate structure provided in a gate region of the mesa, source and drain structures provided on the mesa at opposite sides of the gate structure, and electrical leads connected respectively to the gate, source and drain structures. The process for making the transistor, a multichannel (interdigitated structure) version, and a closed geometry (without mesa) version are also detailed.

4 Claims, 24 Drawing Figures

INVENTOR.
RAINER ZULEEG
BY
- AGENT -

INVENTOR.
RAINER ZULEEG
BY
-AGENT-

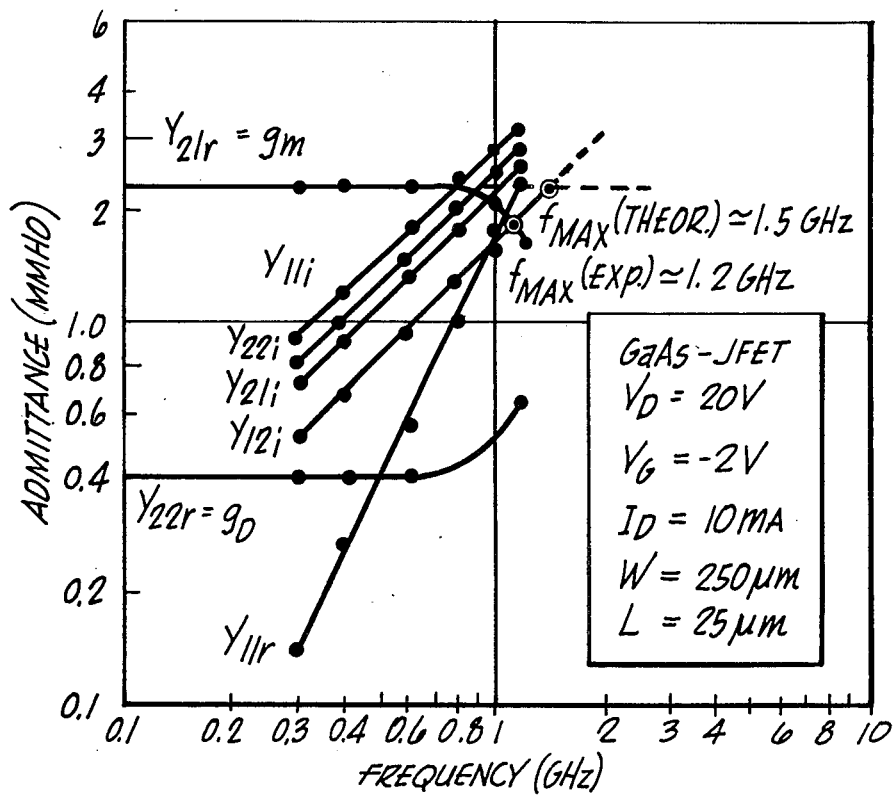
_Fig. 7._
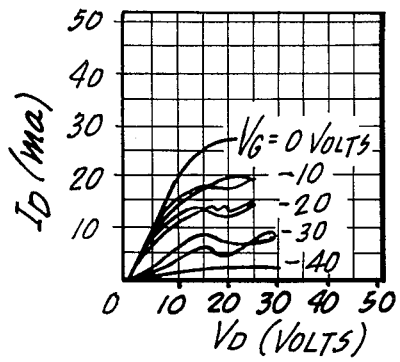
_Fig. 8._
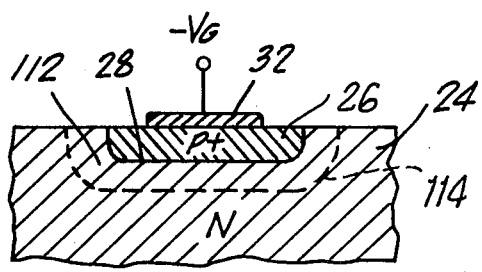
_Fig. 9._
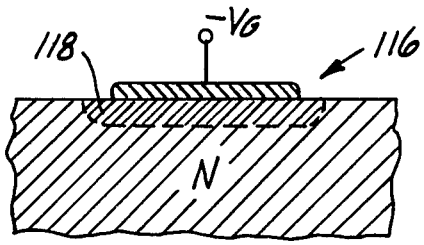
_Fig. 10._
INVENTOR.
RAINER ZULEEG
BY
— AGENT —

MULTICHANNEL JUNCTION FIELD-EFFECT TRANSISTOR AND PROCESS

BACKGROUND OF THE INVENTION

My present invention pertains generally to the field of semiconductor devices and more particularly to a single gate field-effect transistor and the process for making the same.

Generally, the conventional unipolar field-effect transistor is well-known and normally includes a bar of semi-conductor material in which the working current flows between source and drain contacts located on opposite sides of a gate contact or region thereof. The working current is carried in a channel having a variable effective cross sectional area controlled by the gate voltage. When the gate voltage is sufficiently high, the channel through which the working current flows can be pinched off.

The bar of semiconductor material is usually fabricated from silicon (Si) or germanium (Ge) and the gate structure includes both upper and lower gate contact portions. The lower gate contact portion is significantly larger normally than the upper gate contact portion. The comparatively large total gate capacitance of the conventional field-effect transistor reduces its frequency response considerably and presents a serious problem to high frequency operation thereof.

SUMMARY OF THE INVENTION

Briefly, and in general terms, my invention is preferably accomplished by providing a field-effect transistor device having a one-sided geometry wherein a semi-insulating substrate is combined with an isolating mesa structure thereon formed from a thin layer of epitaxially grown semiconductor material of a predetermined impurity concentration, such as N-type gallium arsenide (GaAs), for example, and gate, source and drain structures are suitably provided on the mesa structure. A unipolar single gate transistor device is obtained in which the single gate configuration offers a low gate capacitance that is coupled with the high electron mobility of an N-type channel to realize microwave frequency operation for the transistor device. This transistor device is stable and displays normal field-effect transistor characteristics when operated below a critical electric field intensity. However, when the transistor device is operated above the critical electric field intensity, variable gate-controlled high frequency oscillations can be generated and which are due to the transit-time limited Gunn-effect in the N-type GaAs.

The process for making the single gate field-effect transistor includes the steps of forming a layer of semi-conductor material with a predetermined impurity concentration on a suitably prepared semi-insulating substrate, then forming an extended gate structure in a gate region of the layer of semiconductor material, and forming source and drain structures thereon at opposite sides of the gate structure, and finally forming a mesa structure from the layer of semi-conductor material wherein the mesa structure protrudes above the surface of the substrate and includes the gate, source and drain structures thereon. Of course, electrical leads can be appropriately connected respectively to the gate, source and drain structures.

The extended gate structure in this device provides increased control effectiveness and is preferably a PN-junction gate structure although a Schottky barrier gate structure can be alternately used instead. Also, another version of the device is a multichannel field-effect transistor having an interdigitated structure. A plurality of suitably arranged gate, source and drain structures are provided on a single mesa structure formed on a semi-insulating substrate, and are connected in sets which control a plurality of respective channels in the mesa structure. Such a device has a high frequency response and is additionally capable of very safe, high power operation wherein the power output of the device is determined by the number of channels and the width thereof.

Yet another version of the device is a closed geometry transistor wherein the isolating mesa can be omitted by the use of suitable source, gate and drain configurations. In this instance, isolation is achieved by utilizing a source configuration which surrounds a gate configuration that, in turn, surrounds an appropriate drain configuration. Of course, the source and drain can be interchanged in positions; however, it is preferable in practice to have the drain enclosed by the gate to obtain better working current and output power characteristics.

BRIEF DESCRIPTION OF THE DRAWINGS

My invention will be more fully understood, and other features and advantages thereof will become apparent, from the description given below of exemplary embodiments of the invention and of an illustrative series of steps of a process for making the same. This description of the exemplary embodiments and process is to be taken in conjunction with the accompanying drawings, in which:

FIG. 7 is a graph showing frequency plots of the real and imaginary parts of the admittance parameters of a single gate field-effect transistor operated in the stable mode;

FIG. 8 is a graph showing the drain voltage versus drain current characteristics of a single gate field-effect transistor operated in the unstable mode;

FIG. 9 is a fragmentary sectional view showing the PN-junction gate of the single gate field-effect transistor;

FIG. 10 is a fragmentary sectional view showing a Schottky barrier gate which can be used to replace the PN-junction gate shown in FIG. 9, to provide a single gate, Schottky barrier, field-effect transistor;

DESCRIPTION OF THE PRESENT EMBODIMENTS AND PROCESS

Figure 1:
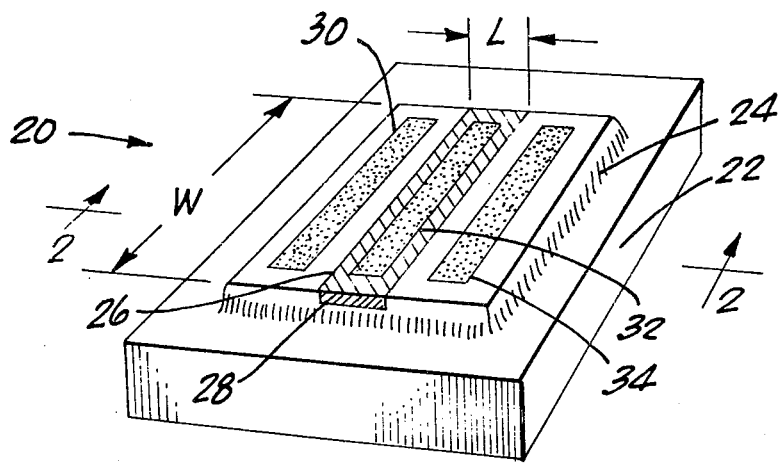
FIG. 1 is a perspective view, somewhat diagrammatic, of an exemplary embodiment of a single gate field-effect transistor constructed according to this invention.

FIG. 1 is a perspective view of a single gate field-effect transistor 20, presenting an exemplary embodiment of my invention. The perspective view of the transistor 20 is somewhat diagrammatic in that it is shown greatly enlarged and the relative dimensions of the different elements thereof may not be in exact and true proportions. The transistor 20 can be designed to operate selectively in either the stable mode as a depletion-type, unipolar field-effect transistor or in the unstable mode as a gate-controlled, negative resistance Gunn-effect device.

The transistor 20 includes a semi-insulating substrate 22 of gallium arsenide (GaAs), an N-type mesa 24 formed from GaAs epitaxial film, a degenerate $P^+$ gate region 26 formed by a zinc (Zn) diffusion technique, a PN-junction 28 located between the P-type material of the gate region 26 and the N-type material of the mesa 24, a metallic $N^+$ source contact 30 of evaporated gold-germanium (Au-Ge) alloyed to the surface of the mesa 24 on one side of the gate region 26, a metallic ohmic or non-rectifying gate contact 32 of Au-Ge alloyed to the surface of the gate region 26, and a metallic $N^+$ drain contact 34 of Au-Ge alloyed to the surface of the mesa 24 on the other side of the gate region 26, for example. The gate region 26 illustratively has a width W of 250 microns and a length L of 25 microns, approximately. The laterally rectangular gate region 25 generally divides the mesa 24 into respectively separate source, gate and drain regions.

Figure 2:
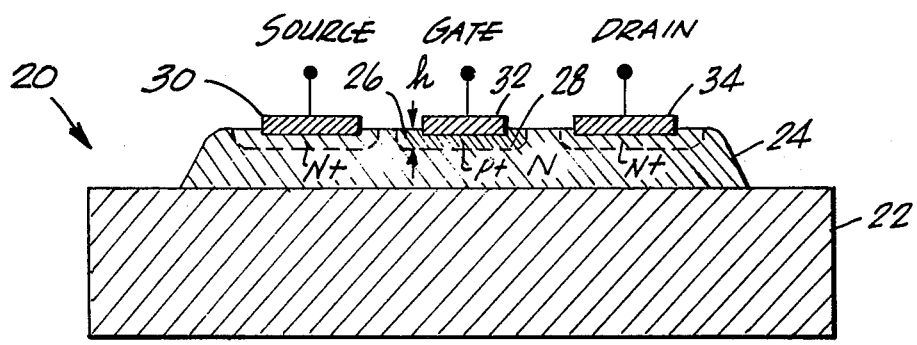
FIG. 2 is a sectional view of the field-effect transistor as taken along the line 2—2 indicated in FIG. 1.

FIG. 2 is a sectional view of the single gate field-effect transistor 20 as taken along the line 2—2 indicated in FIG. 1. The semi-insulating GaAs substrate 22 in this example has a resistivity $\rho$ greater than $10^4$ ohm-cm. The mesa 24 is formed from an N-type GaAs epitaxial film of the order of 5 to 10 microns thick with a donor concentration in the range of $5 \times 10^{14}$ to $5 \times 10^{15}$ cm$^{-3}$, a resistivity around 2 ohm-cm and an electron mobility at room temperature of between 6000 to 8000 cm$^2$/volt-sec. The gate region 26 is produced with a height $h$ of about 2 to 5 microns or approximately one-half the thickness of the GaAs epitaxial film. It can be seen from FIG. 2 that the gate structure, including its region 26 and contact 32, and the adjacent source and drain structures are provided in a generally coplanar arrangement directly on the mesa structure 24. The substrate 22 serves essentially as a semi-insulating support structure, and its overall size and thickness are not particularly important so long as the substrate 22 can provide adequate insulating support for the device. The substrate 22 can be fabricated of semi-insulating GaAs or insulating material such as aluminum oxide ($Al_2O_3$), beryllium oxide (BeO), and the like.

The single gate field-effect transistor 20 thus utilizes an insulating substrate 22 leading to a one-sided geometry. This geometry, in combination with GaAs epitaxy and the inherently higher electron mobility in GaAs over silicon (Si) and gemanium (Ge), helps achieve the high frequency and high power operation of the transistor 20. An advantage of this dielectrically isolated device, arising from its one-sided geometry, is a smaller gate capacitance. Only a single upper gate with its relatively small capacitance is present, and the lower gate with its comparatively large capacitance required in a conventional field-effect transistor is completely eliminated. Accordingly, for the same retainable transconductance, this reduction in total gate capacitance increases the frequency response of the transistor 20 considerably over that of a conventional field-effect transistor.

Figure 3:
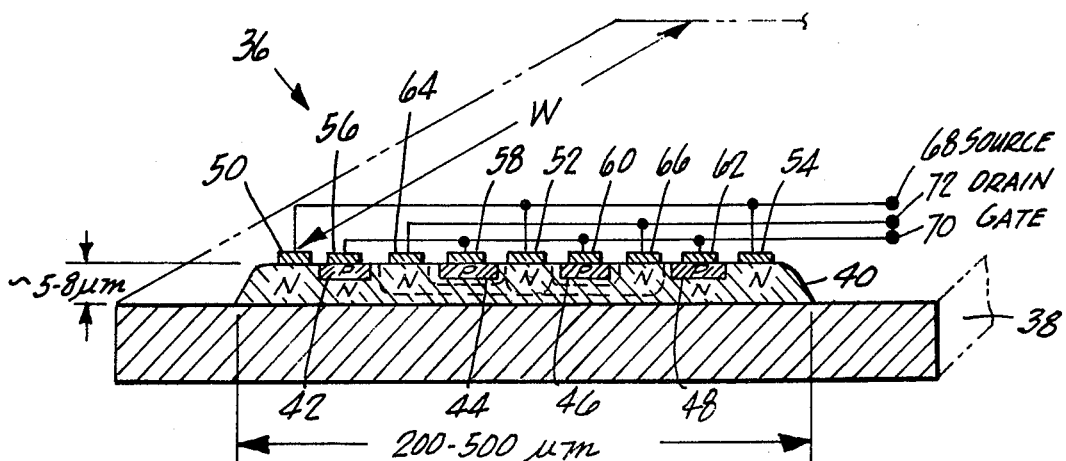
FIG. 3 is a combined sectional and fragmentary perspective view of a multichannel field-effect transistor having an interdigitated structure.

FIG. 3 is a combined sectional and fragmentary perspective view of a multichannel field-effect transistor (MUCH-FET) 36 having an interdigitated structure. In addition to having a high frequency response, very high power output operation is obtained with the interdigitated structure. The transistor 36 illustratively has a four-channel geometry wherein the gate regions and their respectively controlled channels have a width W as indicated. The width of the channels and the number thereof will, of course, determine the power output of the device. The transistor 36 is preferably fabricated using GaAs, for example, since GaAs devices can be safely operated at 350° to 400° C.

The transistor 36 includes a semi-insulating substrate 38 of GaAs, an N-type mesa 40 formed from GaAs epitaxial film, four degenerate $P^+$ gate regions 42, 44, 46 and 48, $N^+$ source contacts 50, 52 and 54, non-rectifying gate contacts 56, 58, 60 and 62, and $N^+$ drain contacts 64 and 66. The source contact 52 serves both channels (indicated between the pairs of broken lines from source contact 52 to the drain contacts 64 and 66) controlled respectively by gates 44 and 46, the drain contact 64 serves both channels controlled respectively by gates 42 and 44, and the drain contact 55 serves both channels controlled respectively by gates 46 and 48. The source, gate and drain contacts are respectively connected together to provide source, gate and drain terminals 68, 70 and 72. Illustratively, the mesa 40 can have a length of 200 to 500 microns, and a thickness of about 5 to 8 microns. A selected number of channels and appropriate width thereof provides a device suitable for integration into linear or swithcing circuits operating at power levels of 5 to 25 watts, for example.

Figure 4A:
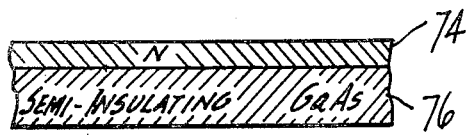
FIGS. 4A, 4B, 4C, 4D, 4E, 4F, 4G, 4H and 4I are fragmentary sectional views which illustrate the principal steps of a process for the fabrication of the single gate field-effect transistor.

FIGS. 4A through 4I are fragmentary sectional views which illustrate the principal steps of my process for fabricating a single gate field-effect transistor device such as the transistor 20 shown in FIGS. 1 and 2. In FIG. 4A, an N-type GaAs film 74 is epitaxially grown on top of a chemically prepared (cleaned) semi-insulating substrate 76 of GaAs which is oriented in, for example, the "100" plane. A vapor phase reactor using arsenic chloride ($AsCl_3$) and gallium (Ga) as source materials and hydrogen ($H_2$) as the carrier gas, can be employed to grow films with a donor concentration between $5 \times 10^{14}$ and $5 \times 10^{15}$ cm$^{-3}$ and electron mobilities at room temperature between 6,000 and 8,000 cm$^2$/volt-sec. Thickness of the films can be accurately controlled between 2 and 20 microns by timing the growth, since a constant growth rate at fixed temperature and gas flow rate can be maintained. The film 74 has a donor concentration $n_d$ of approximately $1 \times 10^{15}$ cm$^{-3}$, electron mobility $u_n$ greater than 7,000 cm$^2$/volt-sec and a thickness of about 8 microns, for example.

Figure 4B:
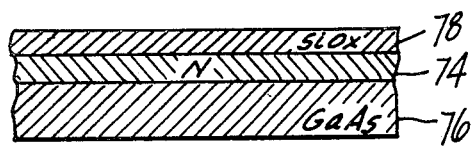
Figure 4C:
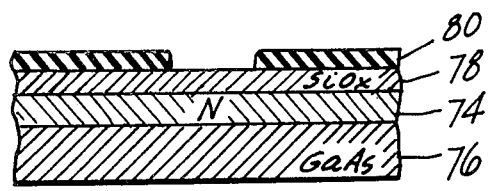
Figure 4D:
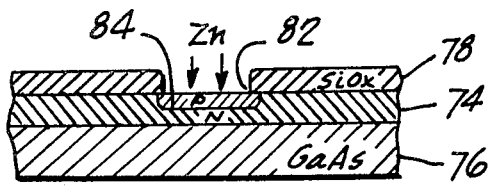

In FIG. 4B, a silica (SiO$_x$) film 78 having a thickness of about 5,000 angstroms (A°) or 0.5 micron was deposited on the GaAs film 74 from sputtering equipment set up and calibrated for the deposition of sodium-free quartz coatings. A photo-resist layer 80 is then provided on the SiO$_x$ film 78, as indicated in FIG. 4C, so that a standard photo-resist etching technique can be applied to cut an opening 82 in the film 78 as shown in FIG. 4D after removal of the photo-resist layer 80. Standard photo-resist etching techniques can be applied with high precision to provide openings as small as 2 to 5 microns which are suitable dimensions for microwave transistors. The 5,000 A° thick SiO$_x$ film 78 including the opening 82 therein can be successfully used as a diffusion mask of Zn. A PN-junction 84 is formed by Zn diffusion as indicated in FIG. 4D. This diffusion is carried out in a closed system at 700 °C using a ternary source of Zn-As-Ga in a composition by weight of 80:110:10. For the illustrative film 74 thickness of 8 microns, the diffusion depth of the PN-junction 84 is approximately one-half of such thickness or about 4 microns.

For a diffusion depth of 2 microns or less, the lateral diffusion at the SiO$_x$ film 78 side interfaces is negligible but becomes more pronounced at deeper diffusions which required a prolonged diffusion cycle. Donor surface concentrations for the 700 °C diffusion were around $1 \times 10^{20}$ cm$^{-3}$, and capacitance-voltage measurements on the PN-junctions produced at such diffusion temperature indicated a close relation in which the reciprocal of the capacitance squared is proportional to the applied voltage. The diffusion of the PN-junction 84 is, of course, confined to a gate region 86 having an illustrative length of 12.5, 25 (exemplary dimension L in FIG. 1) or 50 microns for the majority of the devices that have been successfully constructed and tested. Devices with L dimensions of 4, 8 and 12 microns are being evaluated, and devices with an L dimension of one micron can be made with refined photolithographic techniques. Also, the PN-junction 84 and gate region 86 preferably extend across the entire width of the GaAs film 74 and the substrate 76 at this step of the process. This design will ease the ensuing steps of mesa formation and extends the PN-junction 84 across the surface of the subsequently formed mesa, thus ascertaining complete pinch-off of the working current for proper device operation.

Figure 4E:
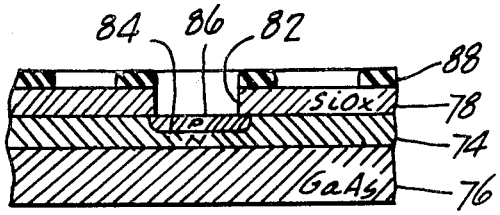
Figure 4F:
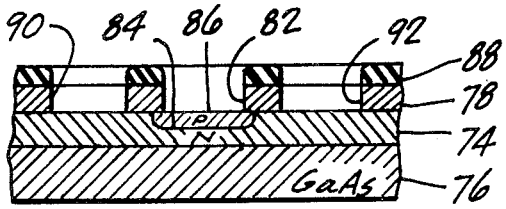
Figure 4G:
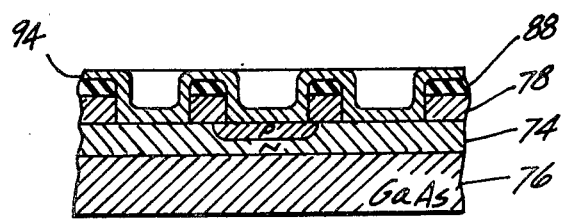

After the diffusion step has been completed, photo-resist is again applied to the wafer as shown in FIG. 4E. Photo-resist layer 88 serves as a means for engraving and opening the source and drain contact areas by the standard photo-resist etching technique to produce openings 90 and 92 in the SiO$_x$ film 78 indicated in FIG. 4F. An evaporated Au-Ge layer 94 is then provided on the photo-resist layer 88 and in the openings 82, 90 and 92 as illustrated in FIG. 4G. Next, alloying of metal contacts to source, gate and drain regions is performed at 550 °C in a reducing atmosphere of hydrogen on a strip heater, for example. The Au-Ge alloy produces N$^+$ contacts to the source and drain regions at the N-type GaAs film 74 in openings 90 and 92, and a non-rectifying contact to the degenerate P$^+$ gate region in opening 82. During alloying, the photo-resist layer 88 burns off and removes the evaporated Au-Ge layer 94 outside the contact areas. Excess material is later removed together with the SiO$_x$ film 78 by using hydrofluoric acid (HF).

Figure 4H:
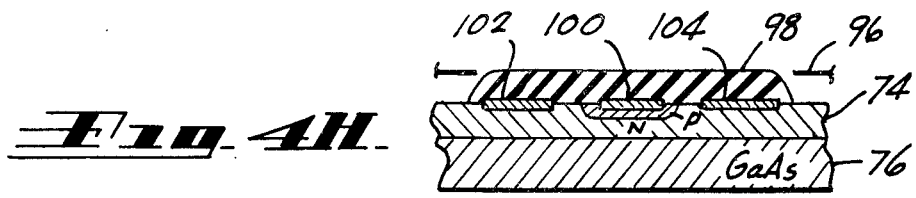
Figure 4I:
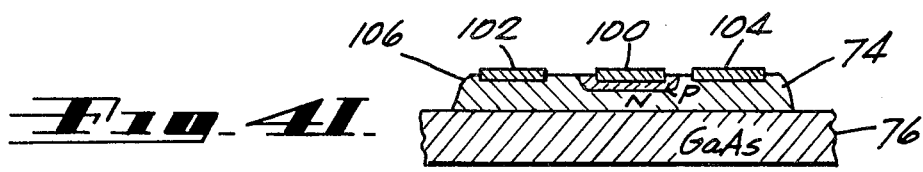

After the removal of the SiO$_x$ and excess metal, a mesa area is defined by evaporating wax through a metal mask 96. Wax is evaporated onto the GaAs film 74 at, for example, 10$^{-4}$ torr pressure through the mask 96. Wax layer 98 covers the gate contact 100, source contact 102 and drain contact 104 as shown in FIG. 4H. Conventional chemical means is used to etch mesa 106 following which the wax layer 98 is dissolved and removed as indicated in FIG. 4I. The chemical etching through the N-type GaAs film 74 gives complete dielectric isolation of individual transistor devices on the semi-insulating substrate 76.

Figure 5:
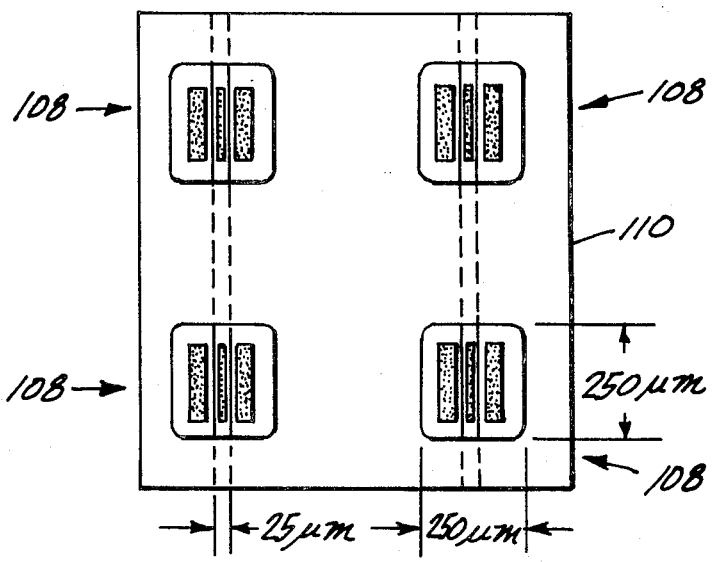
FIG. 5 is a top plan view of four isolated, mesa-etched, devices on a common substrate and ready to be diced, cleaned and suitably mounted to provide separate single gate field-effect transistors.

FIG. 5 is a top plan view of four isolated devices 108 on a common substrate wafer 110 which can be the substrate 76 indicated in FIGS. 4A through 4I. The common substrate wafer 110 is preferably diced to provide separate transistor devices 108. After cleaning, each separate device 108 is ready for mounting on a header or substrate, and thermocompression bonding of electrical connections with respective gate, source and drain contacts. Plan view mesa dimensions of 250 microns by 250 microns and a gate region length dimension of 25 microns are indicated in FIG. 5 to illustrate general proportions of one of the concentrated transistor devices. The broken line extensions of the gate regions represent portions of the PN-junction diffusions which were removed during etching formation of the mesas.

Figure 6:
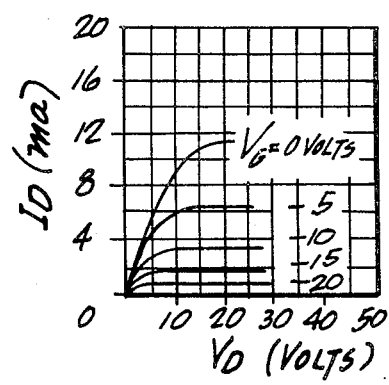
FIG. 6 is a graph showing typical drain voltage versus drain current characteristics of the single gate field-effect transistor operated in the stable mode.

FIGS. 6, 7 and 8 are graphs which illustrate the operative characteristics of the single gate field-effect transistor operated in the stable and unstable modes. The drain voltage-drain current characteristics of a transistor device with a gate region width-to-length ratio W/L of 10 is shown in FIG. 6. This device is stable and functions normally as a depletion-type, unipolar field-effect transistor when operated below the critical field of about 5,000 v/cm for the occurrence of bulk negative resistance in GaAs. The device displays normal field-effect transistor characteristics wherein it is required that the pinch-off voltage $V_p$ for reduction of the drain current to small values, is about the same as the drain voltage necessary for the drain current to saturate. Furthermore, the characteristics for drain current as a function of gate voltage in the saturation region obeys the square law. Maximum transconductance of this device is approximately 1.5 ma/volt and the pinch-off voltage ($V_p$) is about −20 volts, for example.

High frequency properties of these transistor devices are indicated in the graph of FIG. 7 wherein the real and imaginary parts of the admittance (Y) parameters of one of the constructed devices were plotted from admittance bridge measurements as a function of frequency. The particular GaAs junction field-effect transistor (J-FET) measured had a gate region length L of 25 microns and width W of 250 microns. Gate voltage $V_G$ was −2 volts, drain voltage $V_D$ was 20 volts and drain current $I_D$ was 10 ma in this instance. The imaginary parts of the Y-parameters show all of the capacitive susceptance behavior of the transistor device and, from the relationship $Y_{12i} = wC_{12} = 2\pi f C_{12}$, it is obtained $C_{12} = 0.26$ picofarad (pF). The theoretical maximum frequency of oscillation $f_{max}$ (theor.) of approximately 1.5 gigahertz (GHz) is obtained from the relationship $f_{max}$ (theor.) $= g_m/2\pi C_{12}$ with $g_m = 2.3$ ma/volt.

From the measured or experimental results, the actual maximum frequency of oscillation $f_{max}$ (exp.) was found to be approximately 1.2 GHz, which can be also estimated from the approximate relationship $Y_{11r} \simeq g_m (w/w_o)^2$ where $W_o = 2\pi f_o$ and $f_o$ is the intrinsic cutoff frequency of the device.

Degradation of the frequency response of the device is due to parasitic elements thereof. These parasitic elements can be represented as resistance-capacitance (R-C) components in the input and output circuits of the device. The parasitic components in the input circuit form a distributed R-C network which acts as a low pass filter and affects the frequency response of $Y_{21r}$. In addition, the parasitic components in the output circuit present an R-C parasitic load which is a contributing factor to the reduction of power gain and becomes effective above 0.6 GHz, when $Y_{22r}$ starts to increase as shown in FIG. 7. It can also be seen from the indicated measurements that microwave frequency operation of the single gate PN-junction field-effect transistor can be obtained with a gate length L of 5 to 10 microns, but structural refinements are desirable to reduce the parasitic elements in the measured device since such elements ultimately determine the device's frequency response.

The N-type channel transistor device is preferred for microwave frequency operation since the gain and the gainbandwidth product of the unipolar device is directly proportional to the high electron mobility and inversely proportional to the gate capacitance. Owing to the device's high frequency electrical response and its PN-junction gate structure, which is the most insensitive one to the effects of ionizing radiation, the device exhibits good tolerance to fast neutrons and in transient response to ionizing radiation. The P-type channel device, on the other hand, has an order of magnitude lower frequency response for the same device geometry because of the lower hole mobility. In spite of this lower frequency capability, however, it is more radiation tolerant than the N-type channel device for exposure levels above an integrated flux density rate of approximately $10^{15}$ nvt (neutron density-velocity-time or neutrons/cm²), for example.

Devices with gate region heights h of 2 to 5 microns and short lengths L (less than 25 microns, for example) exhibit drain current saturation at drain voltages much less than the voltage necessary to pinch off the channel, and deviate in this respect from the normal field-effect transistor operation. It appears that limiting of the velocity of electrons in a high electric field is responsible for this behavior. The transistor device whose drain voltage-drain current output characteristics, with gate voltage as the parameter, are shown in FIG. 8, has a pinch-off voltage of approximately 40 volts but saturation of drain current occurs at about 15 volts, for example. When the device is operated with drain voltage above 40 to 50 volts, exceeding electric fields of about 5,000 v/cm, a negative differential resistance is introduced therein and the device becomes unstable at low gate voltages. High frequency oscillations are generated and these oscillations are believed to be associated with the transit-time limited, Gunn-effect in N-type GaAs which is a so-called two-valley semiconductor (from curves in the conduction band, energy level diagram of GaAs plotting electron energy against wave number). Other such two-valley semiconductors are N-type indium phosphide (InP) and N-type cadmium telluride (CdTe), for example.

With zero gate voltage; i.e., when the gate contact is tied to the source contact, the transistor device gives the highest frequency of oscillation. Increasing the negative gate bias decreases the frequency of oscillation and ultimately suppresses oscillation at some finite value of drain current, rendering normal field-effect transistor operation. One explanation for the electronic frequency control of the Gunn-effect mode of operation is that of the variation of transit-time and point of nucleation of the domains, since increasing the negative gate voltage results in a thickening of the pinch-off region in the channel. The field within the channel at a sufficiently negative gate voltage is reduced below the critical field needed to produce the negative resistance instabilities. Above the critical field, a tuning range of 2:1 was achieved with the gate-controlled, Gunn-effect device characteristically represented in FIG. 8, wherein voltage-controlled Gunn-effect oscillations were produced from 0.6 to 1.2 GHz by varying the gate voltage applied to the high impedance control gate.

FIGS. 9 and 10 are fragmentary sectional views of the gate portions of respective single gate field-effect transistors constructed according to this invention, comparing two forms of gate structure. In FIG. 9, the gate portion of the single gate field-effect transistor 20 of FIG. 9 is shown wherein PN-junction 28 can be formed by diffusion or selective liquid epitaxy in the GaAs epitaxial film (mesa) 24. Gate contact 32 provides an ohmic or non-rectifying contact to the degenerate P⁺ gate region 26. A depletion region 112 is indicated between the PN-junction 28 and broken line 114. In FIG. 10, a Schottky barrier gate structure 116 is depicted with its depletion region 118 and replaces the PN-junction gate structure shown in FIG. 9. A Schottky barrier field-effect transistor is clearly simpler to fabricate; however, the GaAs PN-junction field-effect transistor is presently the more reliable one of the two.

Figure 11A:
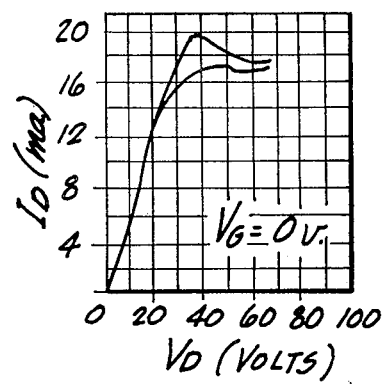
FIGS. 11A and 11B are graphs showing the drain voltage versus drain current characteristics of a single gate field-effect transistor operated in the unstable mode, the graphs corresponding to respectively different gate voltages applied to the transistor.
Figure 11B:
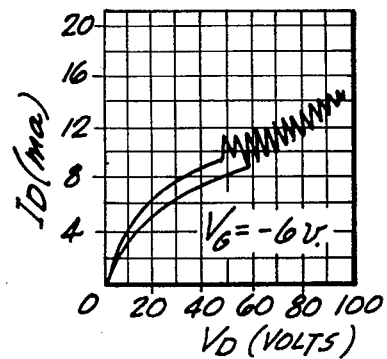

FIGS. 11A and 11B are graphs which present the drain voltage-drain current characteristics for gate voltages $V_G$ of O and −6 volts, respectively, of another transistor device constructed in accordance with this invention. These graphs further illustrate the operation of the invention in the unstable mode. In FIG. 11A, at $V_G = 0$, the typical negative resistance behavior due to the transferred electron mechanism is displayed with subsequent high frequency oscillations. It can then be seen from FIG. 11B that applying −6 volts to the gate reduces the drain current and shifts the onset of negative resistance oscillations to a higher drain voltage.

Figure 12A:
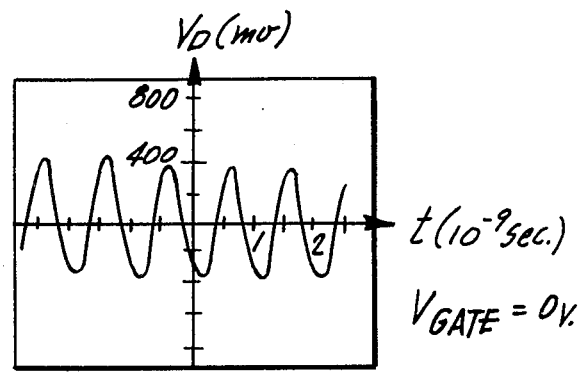
FIGS. 12A and 12B are graphs illustrating the control of the oscillations of a single gate field-effect transistor placed in a tunable cavity, by varying the gate voltage applied to the transistor.
Figure 12B:
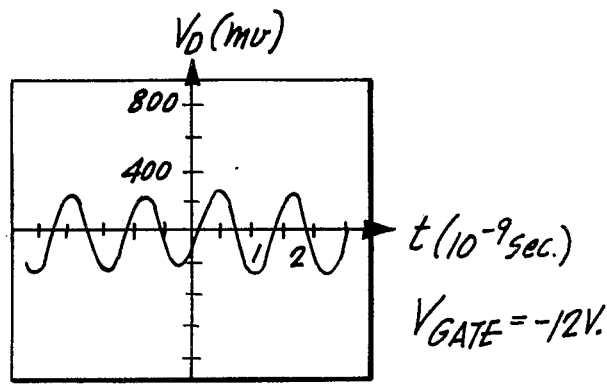

FIGS. 12A and 12B are graphs illustrating the control of the frequency of oscillations of the transistor device by varying the gate voltage thereof. For certain high frequency usage, the device is preferably mounted on an alumina substrate which can be inserted into a 1N23 package. In a two-terminal configuration, the gate connection is tied to the source connection within the plastic or ceramic tubular support housing of the package. For the three-terminal configuration, the gate lead from its connection is passed through a hole in the tubular support housing. The packaged device was placed in a tunable cavity which had a tuning range of 0.6 to 1.2 GHz in order to obtain the results shown in FIGS. 12A and 12B. A bias of 60 volts was applied between the drain and source leads, and the output voltage waveforms of FIGS. 12 and 12B were obtained at gate voltages of 0 and −12 volts, respectively. At the gate voltages of 0 and −12 volts, maximum amplitude of oscillations was obtained corresponding to the frequencies of 1.1 and 0.720 GHz.

Figure 13:
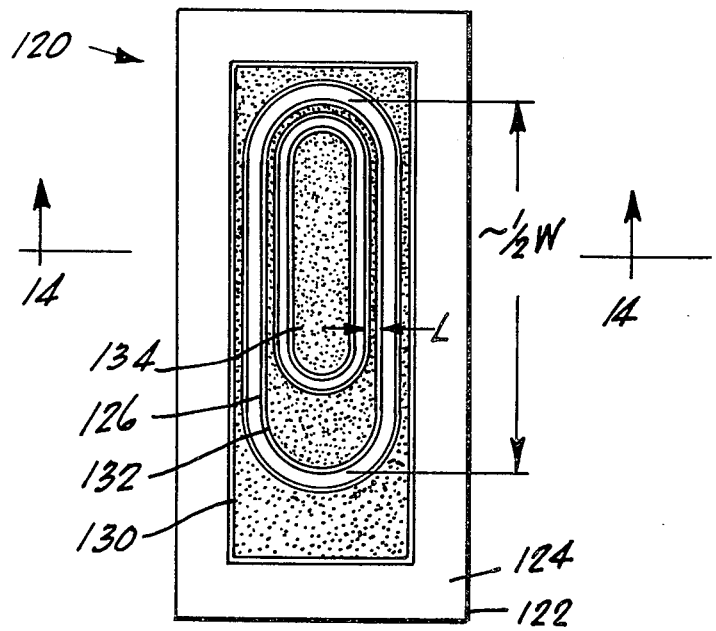
FIG. 13 is a top plan view of a closed geometry version of the single gate field-effect transistor.

FIG. 13 is a top plan view of a closed geometry version of the single gate field-effect transistor. The closed geometry device 120 includes a semi-insulating substrate 122 (FIG. 14) of GaAs, an N-type GaAs epitaxial film or layer 124 on a surface of the substrate 122, a degenerate P$^+$ gate region 126, a PN-junction 128 (FIG. 14) located between the P-type material of the gate region 126 and the N-type material of the layer 124, a metallic N$^+$ source contact 130 of Au-Ge alloyed to the surface of the layer 124 around and spaced from the gate region 126, a metallic ohmic or non-rectifying gate contact 132 of Au-Ge alloyed to the surface of the gate region 126, and a metallic N$^+$ drain contact 134 of Au-Ge alloyed to the surface of the layer 124 within and spaced from the gate contact 132, for example.

It can be seen from FIG. 13 that the gate region 126 has an annular ring configuration and fully encloses or surrounds the drain contact 134 and its associated N$^+$ region. The annular gate region 126 is located between the source contact 130 and the drain contact 134 to isolate completely the drain from the source of the device 120. The source contact 130 and, of course, its associated N$^+$ region can have an annular configuration which fully encloses or surrounds the annular gate region 126. The illustrated source, gate and drain configurations provide complete isolation of the drain from the source and permit the gate to control fully the working current between the source and drain of the device 120. Thus, the closed geometry of the source, gate and drain is the means for providing full isolation (and control) by the gate between the source and drain of device 120. This is in contrast to the isolation (and control) obtained by the gate 32 (FIG. 1) through use of a mesa structure 24 which prevents any stray or leakage current flow between the corresponding ends of the source 30 and drain 34 around the ends of the gate region 26.

Figure 14:
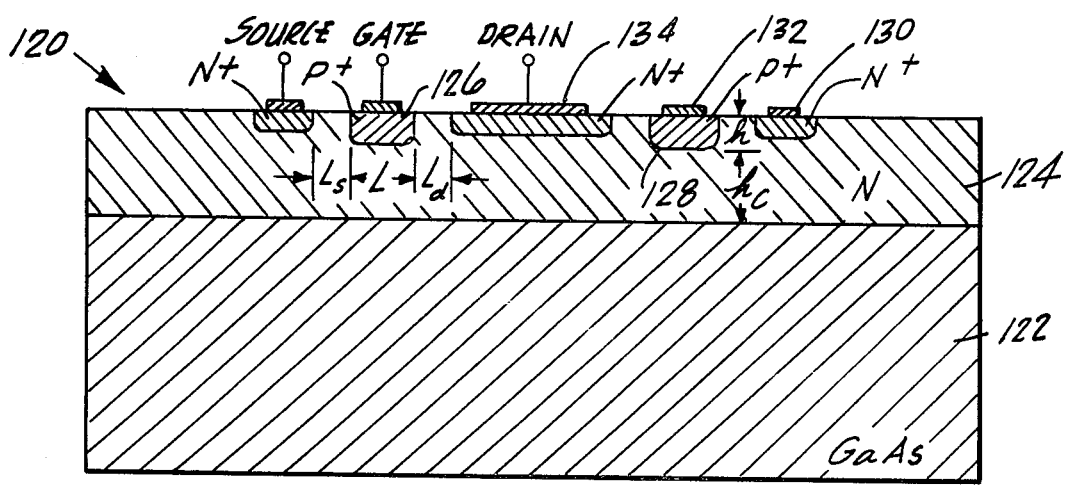
FIG. 14 is a sectional view of the closed geometry version of the field-effect transistor as taken along the line 14—14 indicated in FIG. 13.

FIG. 14 is an enlarged sectional view of the closed geometry device 120 as taken along the line 14—14 indicated in FIG. 13. Source, gate and drain leads can be connected respectively to the wider, lower end portions (FIG. 13) of the contacts 130, 132 and 134. The epitaxial layer 124 is, for example, approximately 4 microns thick doped to a donor concentration $n_d$ of about $3 \times 10^{15}$ cm$^{-3}$ and having an electron mobility $u_n$ of approximately 5,000 cm$^2$/volt-sec. The gate region 126 is produced with a height $h$ of about 2 microns and channel height $h_c$ is illustratively equal to approximately 2 microns, with a pinch-off voltage $V_p$ of about 10 volts. Channel length L, source spacing length $L_s$ and drain spacing length $L_d$ are as indicated in FIG. 14.

Channel width W is the contour distance along the centerline of the gate region 126 (and gate contact 132) around its annular configuration. The linear distance between the upper and lower ends of the annular gate region 126 is, therefore, equal to about W/2 as indicated in FIG. 13. It is noted that the exemplary configurations of the source, gate and drain can have other closed geometry shapes and arrangements than those shown in FIG. 13, of course. For the closed geometry GaAs field-effect transitor device 120, the following table lists some illustrative variations of the parameters L, $L_s$, $L_d$ and W. In a small geometry device, for example, any one of the given values for L in the second column of the table can be selected and used with any one of those for $L_s$ given in the same column. In like manner, values of the indicated parameters for two large geometry devices are given in the third column.

| Parameter | Small Geometry Devices | Large Geometry Devices |
|---|---|---|
| L (microns) | 12, 7.5, 5 | 12, 7.5 |
| $L_s$ (microns) | 7.5, 5 | 7.5 |
| $L_d$ (microns) | 7.5 | 7.5 |
| W (cm) | 0.125 (50 mils) | 0.625 (250 mils) |

While certain dimensions and types of materials have been mentioned in the foregoing description, such dimensions and types of materials were given as examples only and are not intended to limit the scope of my invention in any manner. It is to be understood that the exemplary embodiments of this invention and the process for making the same as described above and shown in the accompanying drawings are merely illustrative of, and not restrictive on, my broad invention and that various changes in design, structure and arrangement may be made therein without departing from the true spirit of the invention.

I claim:

1. A one-sided geometry, high power multichannel, unipolar junction field-effect transistor comprising:

a substrate structure fabricated of semi-insulating GaAs material having a resistivity greater than 10$^4$ ohm-cm;

an isolating mesa structure formed from a thin epitaxial layer of N-type GaAs semiconductor material with a donor concentration between $5 \times 10^{14}$ and $5 \times 10^{15}$ cm$^{-3}$, electron mobilities between 6,000 and 8,000 cm$^2$/volt-sec provided on a top surface of said substrate structure and susceptible of bulk negative resistance instabilities during operation of said field-effect transistor above a critical electric field strength, said substrate structure surface being larger than the supported surface of said mesa structure to provide a one-sided geometry with reduced gate capacitance;

a plurality of source, gate and drain structures provided in a coplanar arrangement directly on said mesa structure in respectively separate transverse coplanar regions thereof and having electrical source, gate and drain leads connected correspondingly thereto, each of said gate structures including a PN-junction having a length and width equal to that of its gate region and largely located in a plane positioned at a predetermined depth from the surface of its corresponding gate region and separating P-type material from the N-type material of said mesa structure, said gate regions being of predetermined length and width and extending equally spaced in parallel over the full width of said mesa structure and being positioned respectively between alternating and equally spaced source and drain regions of predetermined width and similar length to said gate regions to control a plurality of respective channels in an interdigitated structure which functions as a highly reliable, stable and very low leakage current small signal amplifier below said critical electric field strength, and as an easily varied, high frequency and multiple gate controlled oscillator above said critical electric field strength, said gate regions as positioned respectively between said alternating and equally spaced source and drain regions in said coplanar arrangement and of said predetermined length and width being capable to control said bulk negative resistance instabilities and the high frequency oscillations of said oscillator above said critical electric field strength; and means for providing a variable gate voltage on said gate lead to produce said electric field in said transistor.

2. A process for making a one-sided geometry, single gate, junction field-effect transistor, which comprises the steps of:

epitaxially growing a thin layer of N-type GaAs semiconductor material with a donor concentration between $5 \times 10^{14}$ and $5 \times 10^{15}$ cm$^{-3}$ and electron mobilities between 6,000 and 8,000 cm$^2$/volt-sec and susceptible of bulk negative resistance instabilities during operation of said field-effect transistor above a critical electric field strength on a top surface of a substrate structure fabricated from semi-insulating GaAs material having a resistivity greater than $10^4$ ohm-cm;

depositing a silica film on the surface of said epitaxial layer and forming a plurality of lengthwise spaced and parallel channel openings therein, each of said channel openings having a uniform predetermined length and extending across the entire width of said silica film;

forming a plurality of PN-junctions in said epitaxial layer and largely located coplanarly in a plane positioned at a predetermined depth from the surface of said epitaxial layer by diffusion through said channel openings, said PN-junctions separating respective regions of P-type semiconductor material from the N-type semiconductor material of said epitaxial layer;

depositing a photo-resist layer over said silica film and the surface of said epitaxial layer exposed by said channel openings, and forming in said photo-resist layer a plurality of widthwise spaced rectangular gate openings therein of predetermined length and width positioned over and axially aligned with each of said channel openings, a plurality of widthwise spaced rectangular source openings therein of predetermined width and similar length to said gate openings and positioned juxtaposed in parallel thereto on one side thereof, and a plurality of widthwise spaced rectangular drain openings therein of predetermined width and similar length to said gate openings and positioned juxtaposed in parallel thereto on another side thereof;

etching a plurality of source and drain openings in said silica film through said photo-resist source and drain openings;

depositing and alloying a metallic layer over said photo-resist layer and the surface of said epitaxial layer exposed by said gate, source and drain openings in said photo-resist and silica layers to produce a plurality of sets of coplanar source, gate and drain structures including said source, gate and drain contacts having respective coplanar source, gate and drain regions thereunder in said epitaxial layer, said gate regions being portions of said regions of P-type semiconductor material;

forming a plurality of mesa structures from said epitaxial layer, each of said mesa structures being supported on said substrate structure surface and is of predetermined length and width to include a set of said gate, source and drain contacts and their respective regions therein, the gate region width associated with each gate contact being equal to said mesa structure width whereby control effectiveness of said gate structure is increased and said mesa structure provides substantially full isolation of said drain structure from said source structure; and dividing said substrate structure into a plurality of individual devices each having a substrate structure base which is dimensionally larger laterally than its mesa structure, by cross cutting said substrate structure generally parallel and perpendicularly to said PN-junctions in the spaces between said mesa structures, to produce a device which can function as a highly reliable, stable and very low leakage current, small signal amplifier below said critical electric field strength and as an easily varied, high frequency and single gate controlled, oscillator above said critical electric field strength.

3. The invention as defined in claim 1 wherein said mesa structure is rectangular in form with a predetermined length, width and thickness, said mesa structure having a length in the range of about 200 to 500 microns and a thickness in the range of about 5 to 8 microns, said source, gate and drain structures being provided on rectangular transverse coplanar regions of said mesa structure and having rectangular metallic contacts alloyed respectively thereto, said source and drain regions being smaller in width than the full width of said mesa structure, and each of said contacts being nearly equal in length and width to its mesa structure region and connected to its corresponding electrical lead, and said plurality of source, gate and drain structures provided in said coplanar arrangement being odd in number and at least five, said first and last end structures being both of the same type and selected to be one of either of said source and drain structures whereby source and drain structures intermediate to said first and last end structures each serves two successive channels in said multichannel transistor, said gate regions of full mesa width with their large metallic contacts provide increased gate control effectiveness, and said mesa structure provides substantially full isolation of all of said source and drain structures from each other.

4. The invention as defined in claim 2 wherein said plurality of formed PN-junctions are P$^+$N-junctions formed in said epitaxial layer and largely located coplanarly in a plane positioned at a predetermined depth from the surface of said epitaxial layer, said predetermined depth being in the range of about 2 to 5 microns, and said P$^+$N-junctions separating respective regions of P$^+$-type semiconductor material from the N-type semiconductor material of said epitaxial layer, said source, gate and drain regions under said source, gate and drain contacts being respectively N$^+$-type, P$^+$-type and N$^+$-type regions formed in said coplanar arrangement in said epitaxial layer, said gate regions being portions of said regions of P$^+$-type semicondcutor material, and said mesa structures are each formed to be rectangular in form with a predetermined thickness in the range of about 5 to 10 microns, said source and drain regions of each of said mesa structures being formed to be smaller in width than the full width of their mesa structure whereby said gate regions of full mesa width with their large metallic contacts provide said increased gate control effectiveness, and said mesa structures provide said substantially full isolation between their respective drain and source structures.

* * * * *

UNITED STATES PATENT OFFICE
CERTIFICATE OF CORRECTION

PATENT NO. : 3,967,305

DATED : 29 June 1976

INVENTOR(S) : Rainer Zuleeg

It is certified that error appears in the above-identified patent and that said Letters Patent are hereby corrected as shown below:

Column 3, line 45, the numeral "25" should be --26--. Column 4, line 21, the phrase "multichannel field-effect transistor" should read --multichannel field-effect transistor--; line 43, the numeral "55" should be --66--; and line 51, the word "swithcing" should be --switching--. Column 6, lines 57 and 58, the phrase "junction field-effect transistor" should read --junction field-effect transistor--. Column 8, line 26, the phrase "FIG. 9" should read --FIG. 2--.

Signed and Sealed this

Twenty-first Day of June 1977

[SEAL]

Attest:

RUTH C. MASON
*Attesting Officer*

C. MARSHALL DANN
*Commissioner of Patents and Trademarks*